United States Patent [19]

Matsuoka et al.

[11] Patent Number: 5,109,980
[45] Date of Patent: May 5, 1992

[54] IC CARRIER WITH SHAFT COUPLING

[75] Inventors: Noriyuki Matsuoka; Kazumi Uratsuji, both of Tokyo, Japan

[73] Assignee: Yamaichi Electric Mfg. Co., Ltd., Tokyo, Japan

[21] Appl. No.: 631,676

[22] Filed: Dec. 20, 1990

[30] Foreign Application Priority Data

Dec. 22, 1989 [JP] Japan ................... 1-333999

[51] Int. Cl.⁵ .............. B65D 73/02; B65D 51/04; H05K 7/10; H01R 13/62
[52] U.S. Cl. .................. 206/328; 220/338; 361/392; 361/403; 439/73; 439/331
[58] Field of Search .......... 206/328, 329, 331, 332, 206/334; 220/337, 338; 439/73, 331, 893, 136, 142; 361/392, 403; 357/70, 74

[56] References Cited

U.S. PATENT DOCUMENTS

| | | | |
|---|---|---|---|
| 3,391,383 | 7/1968 | Anter | 439/331 |
| 4,007,479 | 2/1977 | Kowalski | 361/403 |
| 4,307,819 | 12/1981 | Araki | 220/338 X |
| 4,515,425 | 5/1985 | Nakano | 439/73 |
| 4,615,441 | 10/1986 | Nakamura | 206/329 |
| 4,663,803 | 5/1987 | Gora | 220/338 X |
| 4,692,790 | 9/1987 | Oyamada | 439/331 X |
| 4,706,161 | 11/1987 | Buckingham | 439/331 X |
| 4,715,835 | 12/1987 | Matsuoka | 206/328 X |
| 4,725,922 | 2/1988 | Matsuoka | 361/392 |
| 4,925,059 | 5/1990 | Harvey et al. | 220/338 |

FOREIGN PATENT DOCUMENTS 60-10310 4/1985 Japan .
60-146089 9/1985 Japan .

Primary Examiner—Bryon P. Gehman
Attorney, Agent, or Firm—Wenderoth, Lind & Ponack

[57] ABSTRACT

An IC carrier has a base and a cover pivotably attached to the base through a shaft coupling. One end of the cover is provided with a plurality of shafts forming the shaft coupling and arranged at spaced intervals. The base is provided with a short recess portion shorter than the length of the shaft and a recess portion equal to or longer than the length of the shafts. The short and long recess portions are spaced on one end of the base at an equal interval to the spacing of the shafts. One end of the recess portions is provided with a shaft receiving portion for receiving ends of the corresponding shaft. The cover can be bent in the thickness direction and the shafts can be inclined in accordance with the bending of the cover. The shaft corresponding to the long recess portion is inserted into the shaft receiving portion at one end of the recess portion via the recess portion, and the shaft corresponding to the short recess portion is inserted into the shaft receiving portion at one end of the short recess portion while the shafts are inclined due to the bending of the cover. The shafts are brought into full engagement in the recess portions by the motion of the cover as it is restored to its unbent condition.

4 Claims, 5 Drawing Sheets

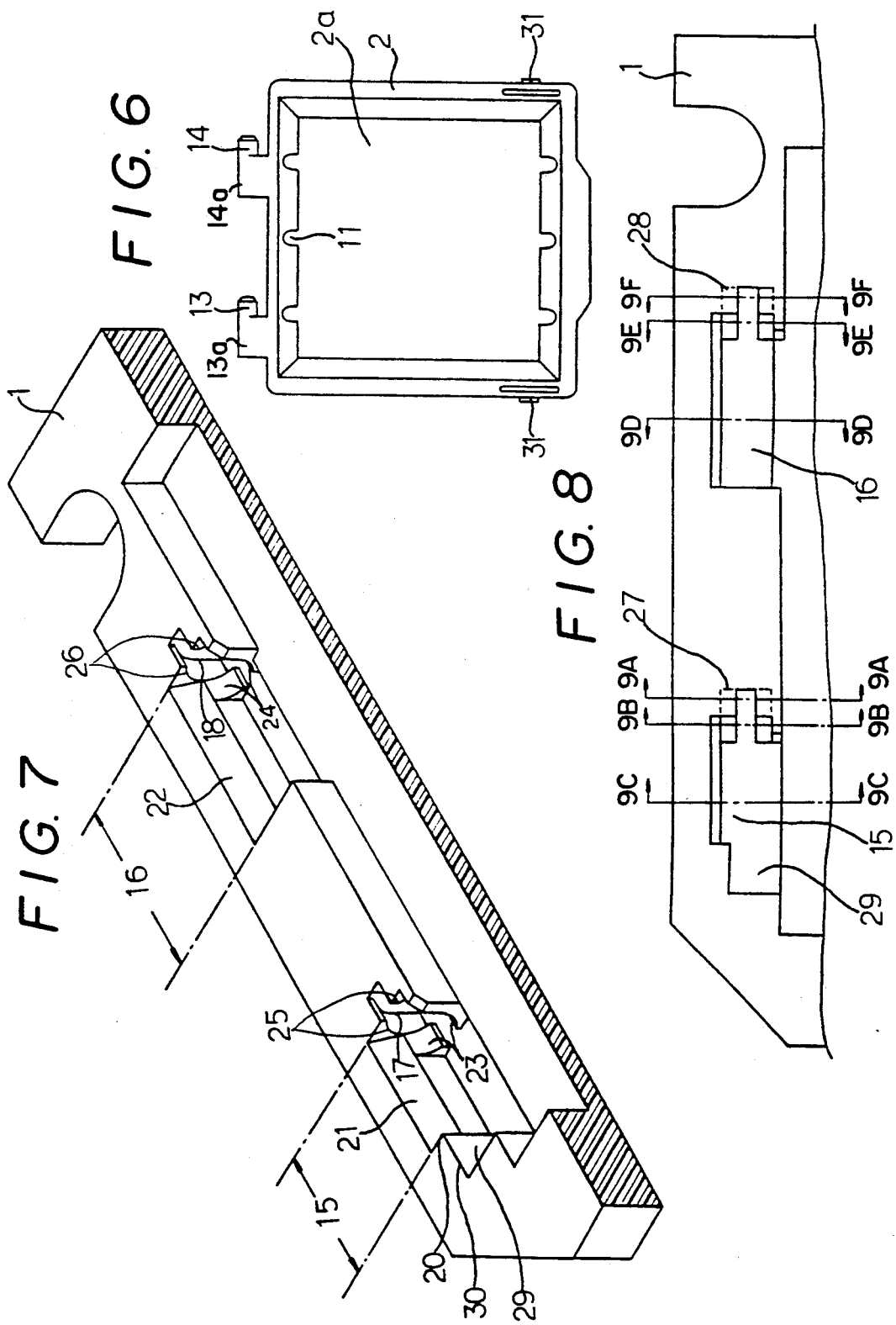

IC CARRIER WITH SHAFT COUPLING

BACKGROUND OF THE INVENTION

1. Field of the Invention

This invention relates to an IC carrier comprising a base and a cover pivotably attached to the base.

2. Brief Description of the Prior Art

An IC carrier disclosed in U.S. Pat. No. 4,007,479 comprises a base, and a cover pivotably connected to the base through an integrally molded hinge. The cover is not removably attached to the base.

IC carriers disclosed in Japanese Utility Model Early Laid-open Publication No. Sho 60-146089 and Japanese Utility Model Publication No. Sho 60-10310 are designed such that a disconnected state of the shaft coupling is formed at a position where a cover is closed against a base.

The latter, for example, has a construction such that the shaft coupling is naturally disconnectable in a pivotal position where the pivot shaft is fitted in a cut-out portion of a key-groove.

One of the above-described conventional IC carriers has a shortcoming that the cover cannot be attached to and removed from the base, while the others have the advantage that the cover can be removably attached to the base but have a shortcoming that the shaft coupling is naturally disconnectable in the position where the cover is closed against the base.

The present invention has been accomplished in view of the above.

SUMMARY OF THE INVENTION

It is therefore an object of the present invention to provide an IC carrier, in which the cover can easily be attached to and removed from the base, the shaft coupling is not accidentally disconnected after the cover has been closed against the base, and such shaft coupling can easily be assembled.

To achieve the above object, according to the present invention, there is essentially provided an IC carrier comprising a base and a cover pivotably attached to said base through a shaft coupling, an IC being held by closing said cover relative to said base, one end of said cover being provided with a plurality of shafts forming said shaft coupling and arranged at spaced intervals in a projecting fashion, one end of said base being provided with a plurality of short recess portions shorter than the length of said shafts forming said shaft coupling and a plurality of recess portions equal to or longer than the length of said shafts, said short and long recess portions being arranged at spaced intervals, one end of each of said recess portions being provided with a shaft insertion portion for receiving the tip of a corresponding shaft, said cover being able to be bent in the thickness direction thereof, said shafts being able to be inclined in accordance with the bending motion of said cover, said shafts corresponding to said long recess portions equal to or longer than the length of said shafts being inserted into said shaft inserting portions at one end of each of said recess portions via said recess portions, said shafts corresponding to said short recess portions shorter than the length of said shafts being inserted into said shaft inserting portions at one end of each of said short recess portions shorter than the length of said shafts when said shafts are inclined owing to bending motion of said cover, said shafts being brought into engagement with said recess portions owing to the motion of said cover when it is restored from its bent condition to its unbent condition.

In the present invention, the shafts mounted on the cover are inclined in accordance with the bending motion of the cover in the backward direction and are inserted into the shaft inserting portions at one end portion of the short recess portions shorter than the length of the shafts, and then brought into engagement with the recess portions by the motion of the cover as it is restored to its unbent condition to assemble the shaft coupling. The shaft coupling can be disassembled by removing the shafts from the shaft inserting portions of the short recess portions shorter than the length of the shafts by bending the cover again in the backward direction. The cover cannot be attached to nor removed from the base unless the cover is bent in the backward direction.

Accordingly, it never happens that the shaft coupling is undesirably disconnected when the cover is simply pivoted in a normal state of use. On the contrary, the shaft coupling can easily be disconnected simply by bending the cover in the backward direction.

The above and other objects, features and advantages of the present invention will become apparent from an understanding of the following detailed description of an embodiment of the invention and with reference to the accompanying drawings.

BRIEF DESCRIPTION OF THE DRAWINGS

FIG. 6 is a plan view of the cover of the IC carrier of FIG. 1;

FIG. 7 is a perspective view, partly in section and on an enlarged scale, of a coupling portion of a shaft of the base of FIG. 4;

FIG. 8 is a plan view of the coupling portion of FIG. 7;

DETAILED DESCRIPTION OF THE EMBODIMENT

Figure 11:
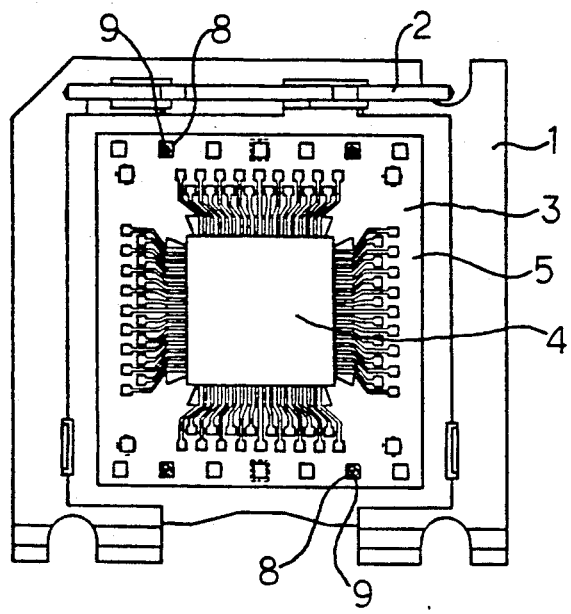
FIG. 11 is a plan view showing the IC carrier with an IC loaded thereon.

FIGS. 1-12 show one embodiment of the present invention. This embodiment is a thin and flat IC carrier which is designed for use with an IC 5 holding an IC chip 4 on a film 3 as shown in FIG. 11.

Figure 12:
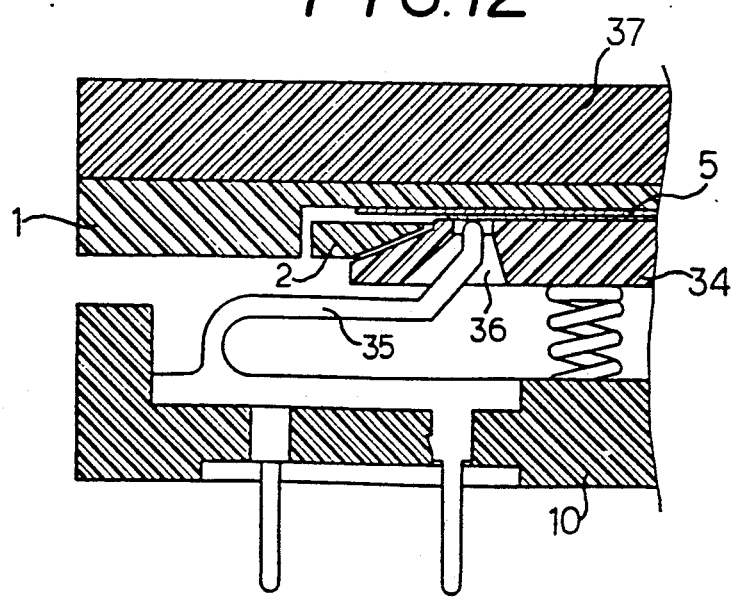
FIG. 12 is a sectional view showing an IC socket with the IC carrier loaded thereon.

The IC carrier comprises a base 1 and a cover 2, the base 1 is shaped as a square frame plate, and an IC accommodating recess 6 is defined in an inner area around an opening portion 1a in the frame plate. A frame plate portion 7 forming a bottom plate of the IC accommodating recess 6 serves as a supporting plate for supporting a peripheral portion of the IC 5. The supporting plate 7 is provided with pins 9 projecting therefrom and adapted to position the IC 5, and the IC positioning pins 9 are inserted into holes 8 for positioning the IC 5 to hold the IC 5 on the base 1 while loading the IC 5 in the IC accommodating recess 6 of the base 1. The supporting plate 7 is provided with positioning holes 12 into which carrier positioning pins disposed on an IC socket 10 shown in FIG. 12 are to be inserted. The cover 2 is a square frame plate, and the square frame plate is engaged with the IC accommodating recess 6 to press the peripheral portion of the IC 5, and positioning holes 11, into which the IC carrier positioning pins disposed on the IC socket 10 and the IC positioning pins 9 are to be inserted, are formed in an edge along the opening 2a of the square frame plate.

As a shaft coupler for pivotally connecting the cover 2 to the base 1 so that the cover 2 can be pivotally opened and closed there are provided a plurality of coaxial shafts 13 and 14 at spaced intervals along one end of the cover 2 and projecting in the same direction from hinge portions 13a and 14a on the cover 2.

The shafts 13 and 14 project in the same direction and coaxial with the pivoting axis of the cover 2.

A short recess portion 15 shorter than the axial length of the respective hinge portions and shafts and a long recess portion 16 equal to or longer than the length of the respective hinge portions and shafts are formed in one edge of the base 1 and spaced in such a manner as to correspond to the positions of the shafts 13 and 14, and the one ends of the respective recess portions 15 and 16 are provided with respective shaft receiving portions 17 and 18 for receiving the ends of the shafts 13 and 14.

Figure 10A:
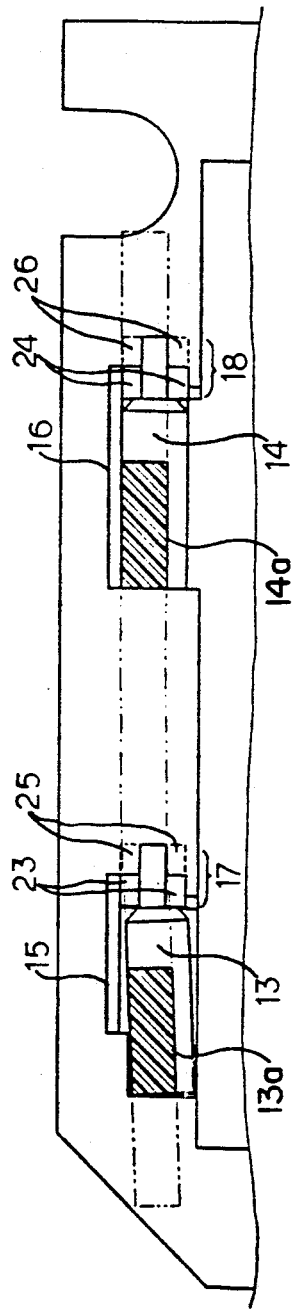
FIGS. 10(A)—10(C) are plan views, partly in section, for explaining the steps for forming a shaft coupling by conforming the shaft portion to a recess portion.
Figure 10B:
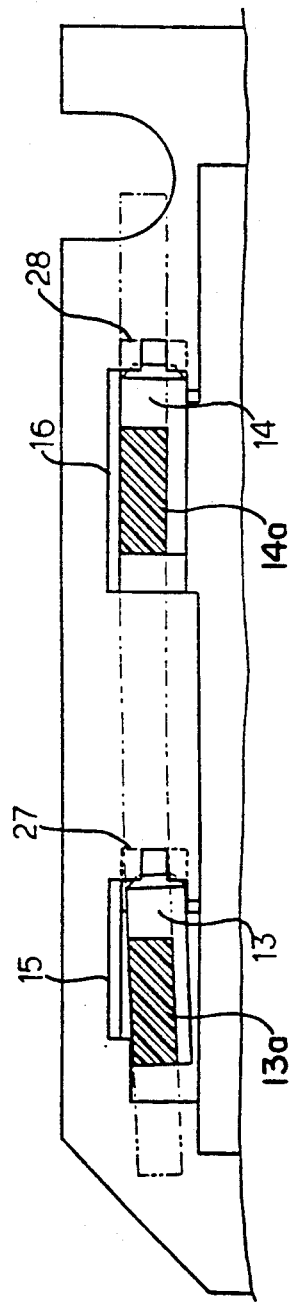

As is shown in FIGS. 10(A) and 10(B), the cover 2 can be backwardly bent in the thickness direction thereof, and by backwardly bending the cover 2, the shafts 13 and 14 can be inclined in the bending direction of the cover 2.

Figure 10C:
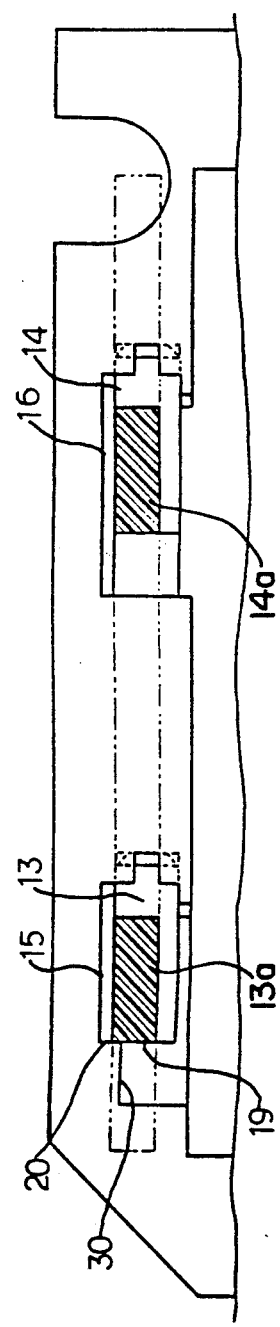

As shown in FIGS. 10(A), 10(B) and 10(C), the shaft 14 corresponding to the long recess portion 16 longer than the length of the shafts and hinge portions is inserted into the shaft receiving portion 18 at one end of the recess portion 16 through the recess portion 16. At the same time, as is shown in FIGS. 10(A) and 10(B), the shaft 13 corresponding to the short recess portion is shorter than the length of the shafts and hinge portions is inserted into the shaft receiving portion 17 at one end of the short recess portion 15 when the shaft 13 is in its inclined state owing to bending over the cover 2 in the backward direction. When the bent cover 2 is restored to its original state upon completion of the insertion of the shaft 13 as shown in FIG. 10(C), the shaft 13 and hinge portion 13a is fully engaged in the receiving portion 7 and recess portion 15, and an opposite end face 19 of the hinge portion 13a from the shaft 13 is contacted with the end face 20 of the recess portion 15 opposite with respect to the shaft receiving portion 17 in order to prevent the shafts 13 and 14 from slipping out of the shaft receiving portions 17 and 18. At that time, the shaft 14 is loosely inserted into the shaft receiving portion 18 within the recess portion 16 with play in the slipping-out direction.

The shaft receiving portions 17 and 18 are formed in the same shape which is shown in FIGS. 9(A)-9(F).

As is shown in FIGS. 9(C) and 9(D), the recess portions 15 and 16 are provided with inclined surfaces 21 and 22 formed at entrance portions of the shafts 13 and 14 and are adapted to enlarge the entrance portions. End portions of the recess portions 15 and 16 at the entrance portions to the shaft receiving portions, as shown in FIGS. 9(B) and 9(E), are provided with arcuate bearing portions for holding arcuate surfaces of the bottom portions of the cylindrical shafts 13 and 14 which are engaged with the recess portions 15 and 16, and also with arcuate bearing portions 25 and 26 for holding upper arcuate surfaces of the shafts 13 and 14 when receiving terminal ends of the shafts 13 and 14 extending into the bearing portions 23 and 24 as shown in FIGS. 9(C) and 9(F) and further with inner bottom surfaces 27 and 28 to be contacted by and stopping by the end faces of the shafts 13 and 14 in the axial direction and to restrict play in the radial direction of the shafts 13 and 14 by the shaft inserting portions 23, 24 and 25, 26.

The short recess portion 15 can have an enlarged recess portion 29 extending therefrom which is longer than the shaft 13. The enlarged recess portion 29 is on the opposite end of recess 15 from the shaft receiving portion 17, and a step portion 30 is formed between the recess portion 15 and the enlarged recess portion 29. As is shown in FIGS. 10(A) and 10(B), the shaft 13 is inclined in accordance with the backward bending motion of the cover 2 and the hinge portion 13a is brought into engagement with the enlarged recess portion 29 so that the tip of the shaft 13, while the end of the hinge portion 13a is engaged with the step portion 30, is inclined and inserted into the shaft receiving portion 17, and upon restoration of the cover 2 to the unbent condition, the hinge portion 13a is brought into engagement with the recess portion 15. However, the arrangement will operate without the provision of the enlarged recess portion 29.

Figure 1:
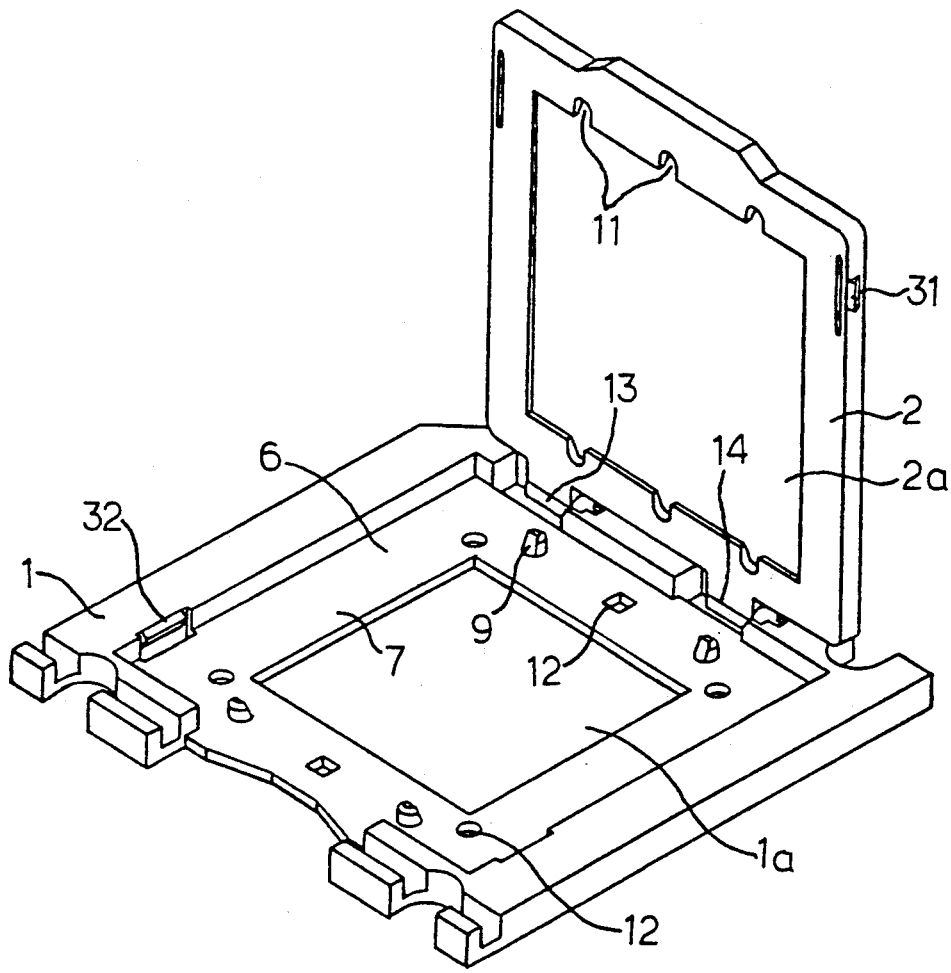
FIG. 1 is a perspective view of an IC carrier according to one embodiment of the present invention and with the cover open.
Figure 2:
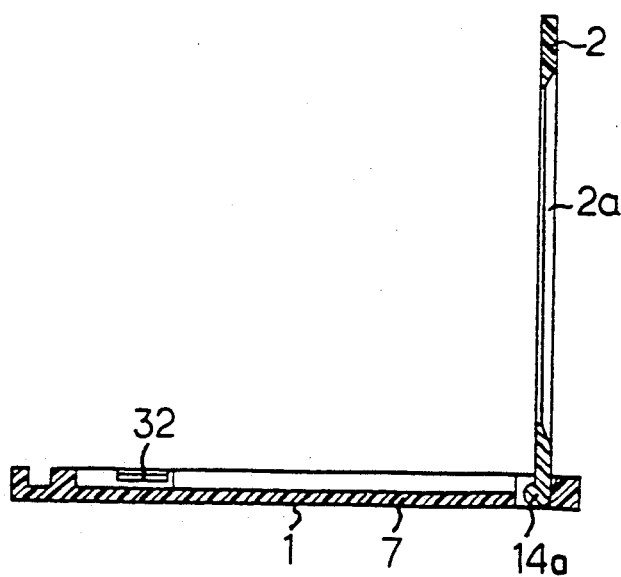
FIG. 2 is a sectional view of the IC cover of FIG. 1.
Figure 3:
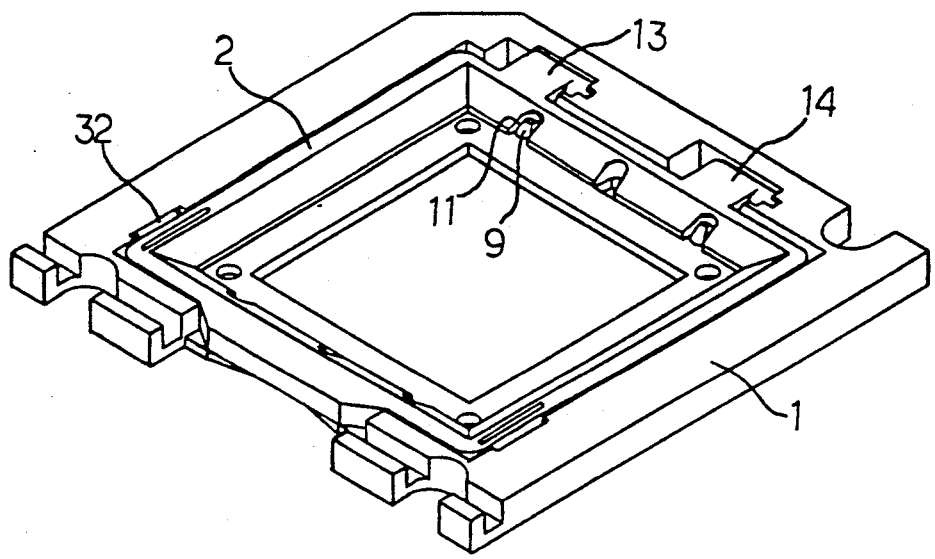
FIG. 3 is a perspective view of the IC carrier of FIG. 1 with the cover closed.
Figure 4:
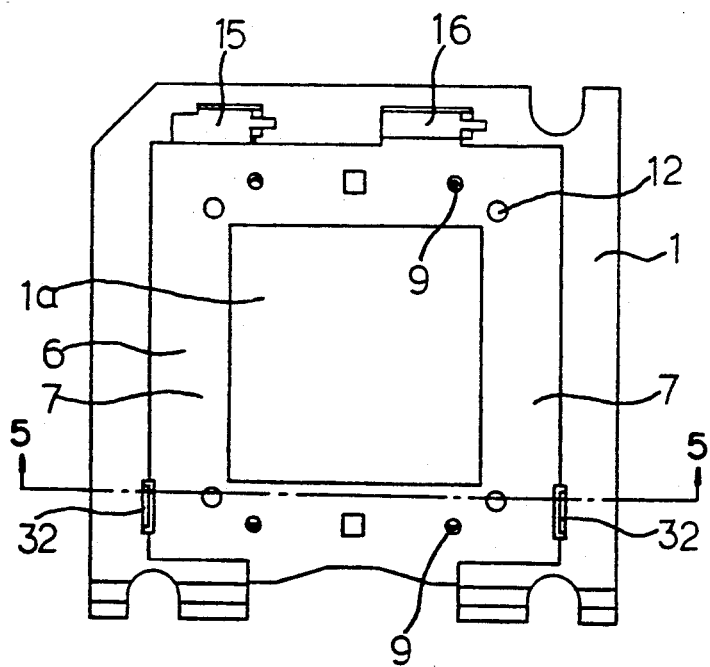
FIG. 4 is a plan view of a base of the IC carrier of FIG. 1.
Figure 5:
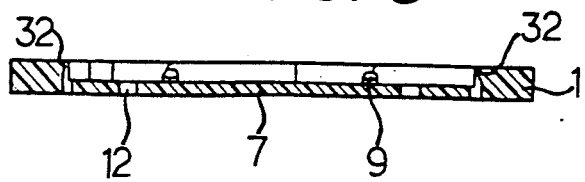
FIG. 5 is a sectional view taken on line 5—5 of FIG. 4.
Figure 9:
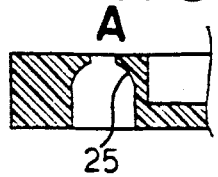
FIG. 9(A) is a sectional view taken on line 9A—9A of FIG. 8.
FIG. 9(B) is a sectional view taken on line 9B—9B of FIG. 8.
FIG. 9(C) is a sectional view taken on line 9C—9C of FIG. 8.
FIG. 9(D) is a sectional view taken on line 9D—9D of FIG. 8.
FIG. 9(E) is a sectional view taken on line 9E—9E of FIG. 8.
FIG. 9(F) is a sectional view taken on line 9F—9F of FIG. 8.
Figure 9:
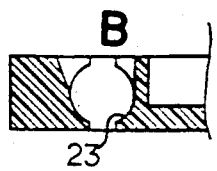
Figure 9:
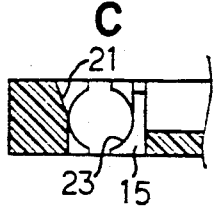
Figure 9:
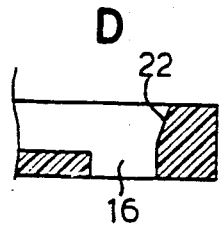
Figure 9:
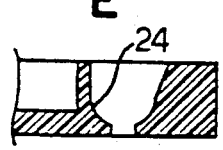
Figure 9:
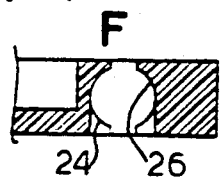

Furthermore, in the above-described embodiment, the recess portions 15 and 16 are open upwardly on the upper surface of the end portion of the base 1, and the cover 2, as shown in FIGS. 1, 2 and 10, is backwardly bent in the thickness direction thereof in order to be brought into an upright state with respect to the base 1, and in that state, the shafts 13 and 14 are inserted into the recess portions 15 and 16 to achieve the above-described engagement. As a modified embodiment, the IC carrier can be designed such that the recess portions 15 and 16 are open on the end faces of the recess portions 15 and 16, and the shafts 13 and 14 are engaged in the recess portions 15 and 16 from the end face.

According to the invention, the cover 2 is pivotably mounted on the base 1, a shaft engagement which is not easily disengaged at any pivoting position is formed, and by closing the cover 2 relative to the base 1, the IC 5 can be held therebetween. In order to lock the IC in the held state, for example, the cover 2 is engaged in the IC accommodating section 6, engaging projections 31 formed in the vicinity of the free end portion of the both sides of the cover 2 are snap engaged with projections 32 formed on the corresponding sides of the IC accommodating section 6, thereby to prevent the cover 2 from being accidentally pivoted in the opening direction.

As is shown in FIG. 12, the carrier carrying the IC 5 is loaded on a table 34 of the socket 10, which can be resiliently moved upward and downward, a contact 35 of the socket 10 is inserted into a contact positioning hole 36, and by intimately contacting the presser plate 37 with the socket 10 to press the base 1, the contact 35 is resiliently contacted with a contacting piece of the IC 5 through the opening 2a of the cover 2.

According to the present invention, the cover causes the shafts, while the shafts are inclined owing to the backward bending of the cover, to be inserted into shaft receiving portions of corresponding short and long recess portions which are respectively shorter than and longer than the length of the shafts, and the shafts are engaged in the receiving portions by the motion of the bent cover as it is restored to its unbent shape to enhance an easy engagement of the shaft coupling. The shaft coupling can easily be disengaged by removing the shafts from the shaft receiving portions of the recesses by bending the cover again in the backward direction.

Owing to the foregoing arrangement, the cover cannot be inserted into nor removed from the recess portions unless the cover is bent backwardly. Accordingly, there is no fear of the shaft coupling becoming disengaged during pivotal movement of the cover. If the cover is bent backwardly, disengagement of the shaft coupling can easily be achieved.

Although the present invention has been described in its preferred form with a certain degree of particularity, it is understood that the present invention can be changed and modified without departing from the spirit and the scope of the invention as hereinafter claimed.

What is claimed is:

1. An IC carrier comprising:
   a base;
   a cover pivotally attached to said base for holding an IC in said carrier by closing said cover relative to said base; and
   a shaft coupling for pivotally attaching said cover to said base, said shaft coupling having two hinge portions on one end of said cover and spaced at an interval and each having a shaft projecting coaxially along a cover pivoting axis therefrom; and
   one end of said base corresponding to said one end of said cover having a short recess portion along an edge thereof with a length substantially equal to the length of said hinge portions in the pivoting axis direction and having a shaft receiving portion extending therefrom coaxially with said pivoting axis in the same direction as the shafts project from a corresponding hinge portion and a distance sufficient to accommodate one of the projecting shafts, and said one end of said base further having a longer recess portion along said edge thereof spaced from said short recess portion at the same interval as the spacing of said hinge portions and with a length longer than the length of said hinge portions in the pivoting axis direction and having a shaft receiving portion extending therefrom coaxially with the pivoting axis in the same direction as the shafts project from a corresponding hinge portion and a distance sufficient to accommodate one of the projecting shafts;
   said cover being bendable in the thickness direction thereof from an unbent condition for inclining said shafts relative to the pivoting axis for, when the cover is to be pivotally attached to said base, permitting the one of said hinge portions in the position corresponding to the longer recess portion to be inserted into the longer recess portion and the projecting shaft thereon to be inserted into the shaft receiving portion extending therefrom and permitting the projecting shaft on the other of said hinge portions in the position corresponding to the short recess portion to be inserted into the shaft receiving portion of the short recess portion and, upon restoring of the cover to the unbent condition, permitting the other of the hinge portions to be inserted into the short recess portion.

2. An IC carrier as claimed in claim 1 in which said shafts project in the same direction from said hinge portions.

3. An IC carrier as claimed in claim 1 in which said hinge portions have circumferential bearing surfaces thereon coaxial with said pivoting axis, and said recess portions having circumferential bearing surfaces therein coaxial with said pivoting axis for supporting said hinge portions when said hinge portions are in said recess portions.

4. An IC carrier as claimed in claim 1 in which said short recess portion has an extension having a depth less than the depth of the short recess portion and extending from the end of the short recess opposite the end from which the shaft receiving portion extends and in a direction away from said shaft receiving portion, said extension partially accommodating a corresponding hinge portion at the time the shaft thereon is inserted into the shaft receiving portion extending from the short recess portion.

* * * * *